(12) United States Patent
Ger et al.

(10) Patent No.: US 8,569,612 B2
(45) Date of Patent: Oct. 29, 2013

(54) JUNCTION BOX

(75) Inventors: Chih-Chan Ger, Jhongli (TW);
Yun-Bing Wang, Jhongli (TW)

(73) Assignee: Ampower Technology Co., Ltd.,
Jhongli, Taoyuan County (TW)

( * ) Notice: Subject to any disclaimer, the term of this patent is extended or adjusted under 35 U.S.C. 154(b) by 294 days.

(21) Appl. No.: 13/151,267

(22) Filed: Jun. 1, 2011

(65) Prior Publication Data

US 2012/0274389 A1    Nov. 1, 2012

(30) Foreign Application Priority Data

Apr. 26, 2011    (CN) .......................... 2011 1 0105103

(51) Int. Cl.
*H01L 31/00*    (2006.01)
(52) U.S. Cl.
USPC ......................................................... 136/255

(58) Field of Classification Search
USPC ......................................................... 136/255
See application file for complete search history.

(56) References Cited

U.S. PATENT DOCUMENTS 6,225,793 B1 *    5/2001    Dickmann .................... 323/230

\* cited by examiner

*Primary Examiner* — Thanh Luu
(74) *Attorney, Agent, or Firm* — Altis & Wispro Law Group, Inc.

(57) ABSTRACT

A junction box electronically connected to a solar panel and connected to a plurality of solar cell strings connected in series includes a first bypass diode string and at least one second bypass diode. The first bypass diode string includes a plurality of first bypass diodes forwardly connected in series, and each of the plurality of first bypass diodes is connected to a corresponding one of the plurality of solar cell strings in parallel. The at least one second bypass diode connected to at least two neighboring solar cell strings in parallel, turns on to bypass the at least two neighboring solar cell strings upon the condition that the at least two neighboring solar cell strings are abnormal simultaneously.

6 Claims, 5 Drawing Sheets

JUNCTION BOX

BACKGROUND

1. Technical Field

The disclosure relates to solar power systems, and particularly to a junction box.

2. Description of Related Art

In solar power systems, a plurality of solar cell strings are connected in series to form a solar panel, and then a plurality of solar panels connected in series to provide power. In the solar panel, each of the plurality of solar cell strings is connected to a bypass diode in parallel. Thus, when one of the plurality of solar cell strings is damaged or shaded, corresponding bypass diode is turned on to make current of other solar cell strings to flow out from the solar panel. However, if there are a plurality of solar cell strings are abnormal, a plurality of bypass diodes are turned on, which results in high power loss.

DETAILED DESCRIPTION

As used herein, the term "solar cell" is defined as a system that converts sunlight directly into direct current (DC) power. Assemblies of solar cells are used to make "solar cell strings". The term "solar panel" is defined to be an assembly of solar cell strings. The term "junction box" is defined to be a container in a solar panel for electrical connections, especially for electrical connections of solar cell strings, usually intended to conceal electrical connections from sight and deter tampering.

Figure 1:
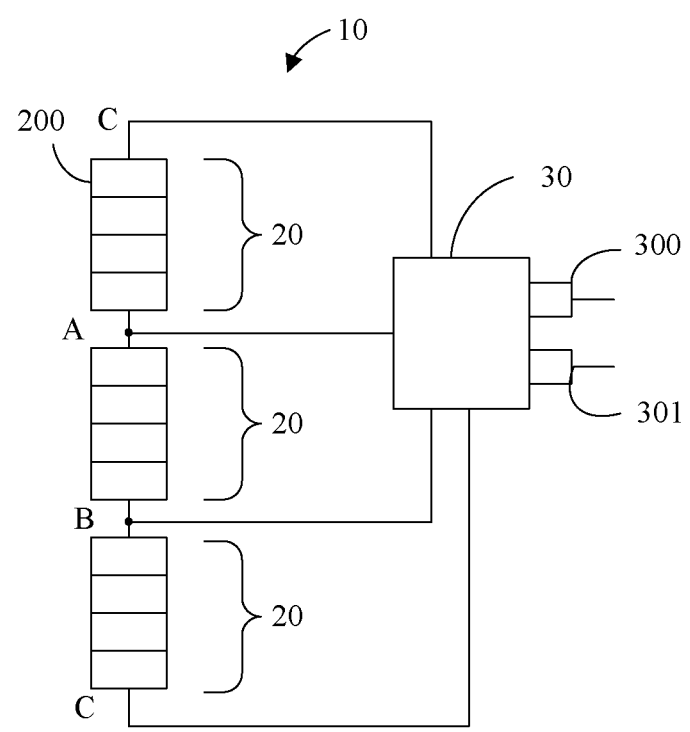
FIG. 1 is a schematic diagram of one embodiment of a solar panel.

FIG. 1 is a schematic diagram of one embodiment of a solar panel 10. In one embodiment, the solar panel 10 includes a plurality of solar cell strings 20 connected in series and a junction box 30. Three solar cell strings 20 are shown in FIG. 1 for example. Each of the plurality of solar cell strings 20 includes a plurality of solar cells 200 connected in series, to convert sunlight into direct current (DC) power. The junction box 30 is connected to the plurality of solar cell strings 20, and outputs the DC power generated by the plurality of solar cell strings 20. The junction box 30 includes two output ports 300, 301 to output the DC power generated by the plurality of solar cell strings 20.

In one embodiment, the junction box 30 is connected to two outputs of each of the plurality of solar cell strings. For example, if there are two solar cell strings 20 in the solar panel 10, the junction box 30 is connected to two unjunction nodes of the two solar cell strings 20 via two wirings and connected to a junction node of the two solar cell strings 20 via one wiring. In the embodiment, the unjunction node is defined as a node that is connected to only one solar cell string 20, and the junction node is defined as a node that is simultaneously connected to at least two solar cell strings 20. For example, if there are three solar cell strings 20 in the solar panel 10, as shown in FIG. 1, the junction box 30 is connected to two unjunction nodes C of the three solar cell strings 20 via two wirings and connected to junction nodes A and B configured at junctions of neighboring two of the three solar cell strings 20 via two wiring. Therefore, the junction box 30 is connected to n solar cell strings 20 via n+1 wirings.

Figure 2:
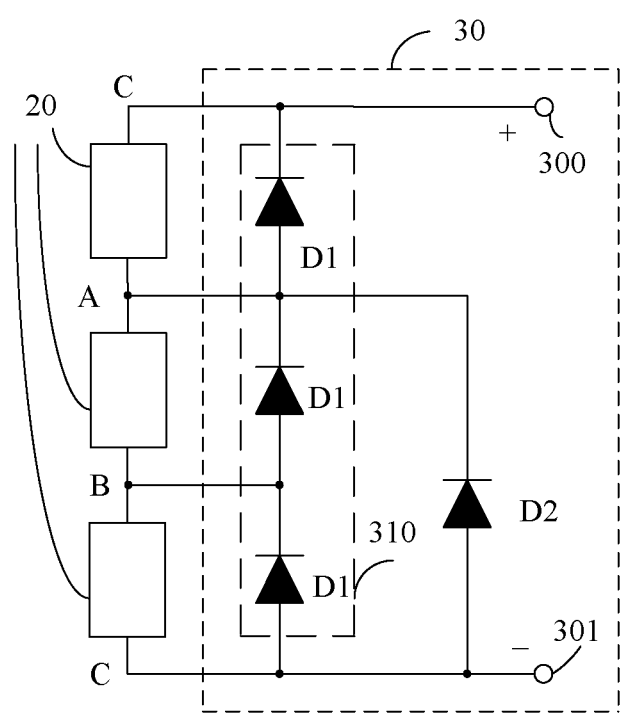
FIG. 2 is a schematic diagram of a first embodiment of a junction box as disclosed.

FIG. 2 is a schematic diagram of a first embodiment of a junction box 30 as disclosed. In one embodiment, the junction box 30 includes a first bypass diode string 310, at least one second bypass diode D2, and the two output ports 300, 301. The first bypass diode string 310 includes a plurality of first bypass diodes D1 forwardly connected in series. A cathode of a first one of the plurality of first bypass diodes D1 acts as a cathode of the first bypass diode string 310, an anode of the first one of the plurality of first bypass diodes D1 is connected to a cathode of a second one of the plurality of first bypass diodes D1, and an anode of the second one of the plurality of first bypass diodes D1 is connected to a cathode of a third one of the plurality of first bypass diodes D1. As may be deduced, an anode of a previous one of the plurality of first bypass diodes D1 is connected to a cathode of a next one of the plurality of first bypass diodes D1, and an anode of a last one of the plurality of first bypass diodes D1 acts as an anode of the first bypass diode string 310. The plurality of first bypass diodes D1 and the plurality of solar cell strings 20 have same quantify. Each of the plurality of first bypass diodes D1 is connected to a corresponding one of the plurality of solar cell strings 20 in parallel, and is turned on to bypass the corresponding solar cell string 20 when the corresponding solar cell string 20 is abnormal.

In one embodiment, anodes of the plurality of first bypass diodes D1 are connected to negative outputs of the corresponding solar cell strings 20, and cathodes of plurality of first bypass diodes D1 are connected to positive outputs of the corresponding solar cell strings 20. When the plurality of solar cell strings 20 are normal, the voltage of the cathode of the plurality of first bypass diodes D1 is greater than that of the anodes of the plurality of first bypass diodes D1, the plurality of first bypass diodes D1 are off. If one of the plurality of solar cell strings 20 is abnormal, current cannot flow through the abnormal solar cell string 20, instead, the current flowing through the corresponding first bypass diode D1 in parallel with the abnormal solar cell string 20.

The at least one second bypass diode D2 is connected to at least two neighboring solar cell strings 20 in parallel, and turns on to bypass the at least two neighboring solar cell strings 20 upon the condition that the at least two neighboring solar cell strings 20 are abnormal simultaneously. That is, a cathode of the at least one second bypass diode D2 is connected to a cathode of a first one of at least two neighboring first bypass diodes D1 corresponding to the at least two neighboring solar cell strings 20, and an anode of the at least one second bypass diode D2 is connected to an anode of a last one of the at least two neighboring first bypass diodes D1 corresponding to the at least two neighboring solar cell strings 20. When the at least two neighboring solar cell strings 20 are abnormal simultaneously, the second bypass diode D2 is turned on, and the first bypass diodes D1 are not conducted. Thus, other normal solar cell strings 20 and the second bypass diode D2 output the DC power via the two output ports 300, 301 of the junction box 30. When the at least two neighboring solar cell strings 20 are abnormal simultaneously, one second bypass diode D2 is turned on to replace with at least two first bypass diode D1, resulting in reduced numbers of turned on diodes. Thus, conduction loss of bypass diodes is reduced, and temperature of elements and temperature inside the junction box 30 are effectively reduced, which avoids unsafe problems generated by high temperature and extends life of the junction box 30.

The two output ports 300, 301 are connected to two ends of the first bypass diode string 310, and output the DC power generated by the plurality of solar cell strings 20. The output port 300 connected to the cathode of the first bypass diode string 310 acts as a positive port, and the output port 301 connected to the anode of the last bypass diode string 310 acts as a negative port. That is, the positive output port 300 is connected to the positive output of a first one of the plurality of solar cell strings 20, and the negative output port 301 is connected to the negative output of a last one of the plurality of solar cell strings 20.

In this embodiment, the at least one second bypass diode D2 is connected to two neighboring solar cell strings 20, such as, the second and the third solar cell strings 20, in parallel. The first bypass diodes D1 and the second bypass diode D2 may have different parameters or types, such as, different maximum forward voltages and maximum peak reverse voltages.

Figure 3:
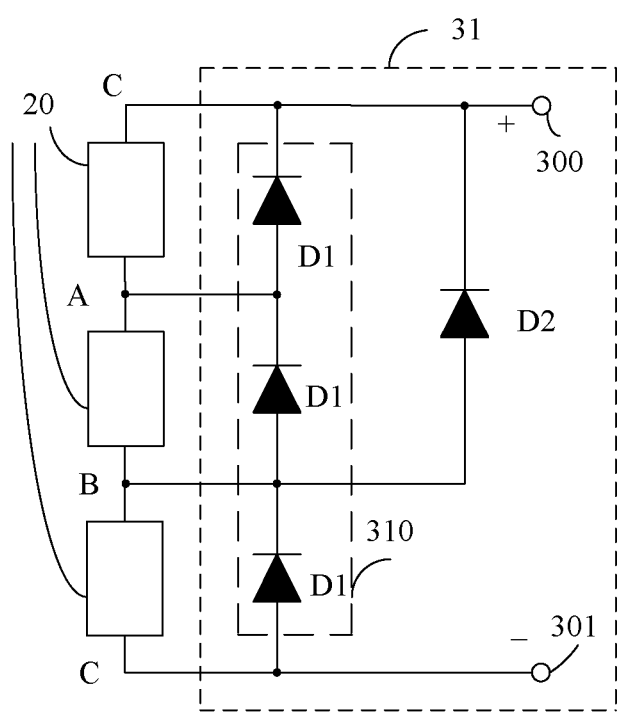
FIG. 3 is a schematic diagram of a second embodiment of a junction box as disclosed.
Figure 4:
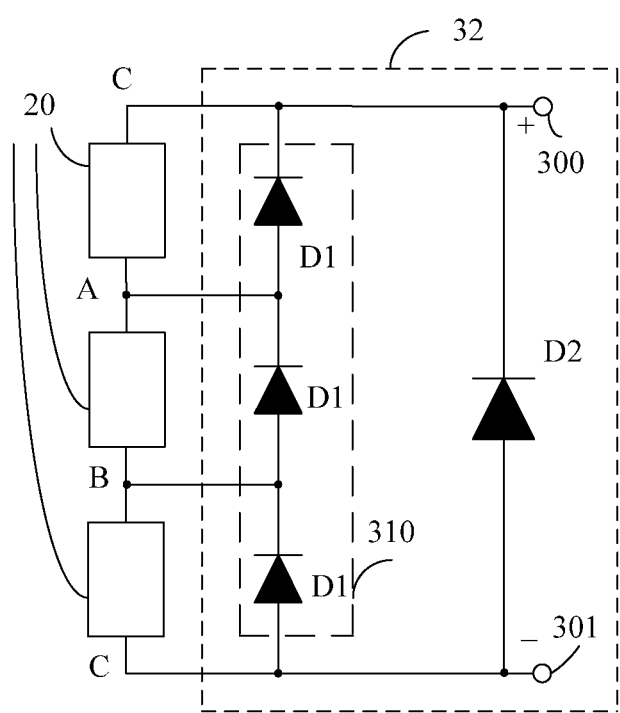
FIG. 4 is a schematic diagram of a third embodiment of a junction box as disclosed.
Figure 5:
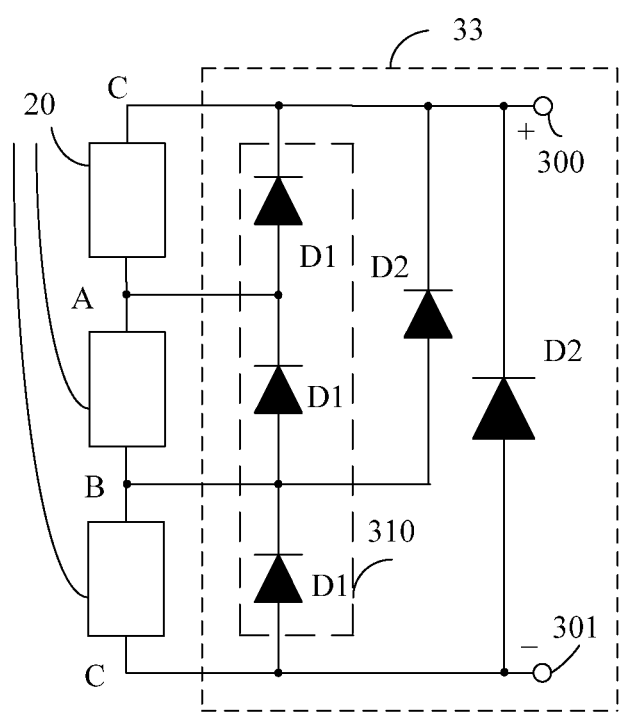
FIG. 5 is a schematic diagram of a fourth embodiment of a junction box as disclosed.

FIGS. 3 to 5 are schematic diagrams of second to fourth embodiments of a junction box 31, 32, 33 as disclosed. The junction boxes 31, 32, 33 are similar to the junction box 30 except a connection of the at least one second bypass diode D2. In FIG. 3, the at least one second bypass diode D2 of the junction box 31 is also connected to two neighboring solar cell strings 20, such as, the first and the second solar cell strings 20, in parallel. In FIG. 4, the at least one second bypass diode D2 of the junction box 32 is connected to three neighboring solar cell strings 20, that is, the first, the second, and the third solar cell strings 20, in parallel. In FIG. 5, the junction box 33 includes two second bypass diode D2 with one connected to the first to the second solar cell strings 20 in parallel and another one connected to the first to the third solar cell strings 20 in parallel.

The junction boxes 30 to 33 include at least one additional second bypass diode D2 in parallel with at least two neighboring solar cell strings 20, such as, three or two. Thus, when the at least two neighboring solar cell strings 20 are abnormal simultaneously, the second bypass diode D2 is turned on to replace with the plurality of first bypass diodes D1, resulting in reduced numbers of turned on diodes. Thus, conduction loss of bypass diodes is reduced, and temperature of elements and temperature inside the junction boxes 30 to 33 are effectively reduced, which avoids unsafe problems generated by high temperature and extends life of the junction boxes 30 to 33.

The foregoing disclosure of various embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto and their equivalents.

What is claimed is:

1. A junction box, electronically connected to a solar panel and connected to a plurality of solar cell strings connected in series, the junction box comprising:
   a first bypass diode string, comprising a plurality of first bypass diodes forwardly connected in series, wherein each of the plurality of first bypass diodes is connected to a corresponding one of the plurality of solar cell strings in parallel; and
   at least one second bypass diode, connected to at least two neighboring solar cell strings in parallel, wherein the at least one second bypass diode turns on to bypass the at least two neighboring solar cell strings upon the condition that the at least two neighboring solar cell strings are abnormal simultaneously;
   wherein the first bypass diodes and the second bypass diodes have different maximum forward voltages and different maximum peak reverse voltages.

2. The junction box of claim 1, further comprising two output ports connected to two ends of the first bypass diode string, to output power generated by the plurality of solar cell strings.

3. The junction box of claim 2, wherein the two output ports comprise a positive port and a negative port, the positive port is connected to a cathode of the first bypass diode string, and the negative port is connected to an anode of the last bypass diode string.

4. A junction box, electronically connected to a solar panel and connected to a plurality of solar cell strings connected in series, the junction box comprising:
   a first bypass diode string, comprising a plurality of first bypass diodes forwardly connected in series, wherein each of the plurality of first bypass diodes is connected to a corresponding one of the plurality of solar cell strings in parallel; and
   at least one second bypass diode, connected to at least two neighboring first bypass diodes in parallel, wherein a cathode of the at least one second bypass diode is connected to a cathode of a first one of the least two neighboring first bypass diodes, and an anode of the at least one second bypass diode is connected to an anode of a last one of the least two neighboring first bypass diodes;
   wherein the first bypass diodes and the second bypass diodes have different maximum forward voltages and different maximum peak reverse voltages.

5. The junction box of claim 4, further comprising two output ports connected to two ends of the first bypass diode string, to output power generated by the plurality of solar cell strings.

6. The junction box of claim 5, wherein the two output ports comprises a positive port and a negative port, the positive port is connected to a cathode of the first bypass diode string, and the negative port is connected to an anode of the last bypass diode string.

* * * * *